United States Patent
Onji et al.

(10) Patent No.: US 11,409,164 B2
(45) Date of Patent: Aug. 9, 2022

(54) LIGHT CONVERSION MEMBER

(71) Applicant: TORAY ENGINEERING CO., LTD., Tokyo (JP)

(72) Inventors: Takuya Onji, Otsu (JP); Masaki Mori, Yasu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 346 days.

(21) Appl. No.: 16/464,864

(22) PCT Filed: Oct. 31, 2017

(86) PCT No.: PCT/JP2017/039361
§ 371 (c)(1),
(2) Date: May 29, 2019

(87) PCT Pub. No.: WO2018/105272
PCT Pub. Date: Jun. 14, 2018

(65) Prior Publication Data
US 2019/0302536 A1    Oct. 3, 2019

(30) Foreign Application Priority Data
Dec. 5, 2016 (JP) .............................. JP2016-235709

(51) Int. Cl.
*G02F 1/13357* (2006.01)
*B32B 7/02* (2019.01)
(Continued)

(52) U.S. Cl.
CPC .......... *G02F 1/133621* (2013.01); *B32B 7/02* (2013.01); *G02B 5/20* (2013.01);
(Continued)

(58) Field of Classification Search
CPC ......... G02F 1/133621; G02F 1/133614; G02F 1/1335; G02B 5/20; C09K 2323/031; H01L 33/50; H01L 33/502; H01L 33/504
See application file for complete search history.

(56) References Cited

U.S. PATENT DOCUMENTS

2016/0161657 A1\* 6/2016 Yamada ............... G02B 6/0023
349/62
2018/0231693 A1\* 8/2018 Murata ................... B32B 23/20

FOREIGN PATENT DOCUMENTS

CN    109983373 B  * 10/2021 ............... B32B 7/02
JP    2015-065158 A     4/2015
(Continued)

OTHER PUBLICATIONS

International Search Report of the corresponding International Application No. PCT/JP2017/039361, dated Jan. 30, 2018.

*Primary Examiner* — Sophie Hon
*Assistant Examiner* — Sow-Fun Hon
(74) *Attorney, Agent, or Firm* — Global IP Counselors, LLP

(57) ABSTRACT

A light conversion member includes a light conversion film, a first gas barrier, and a first base material. The light conversion film converts color of light from a specific color. The first gas barrier is located on a side of the light conversion film where the light to be converted is incident. The first gas barrier includes one or more gas barrier layers that prevent moisture and gas from entering the light conversion film. The first base material is located on an opposite side of the first gas barrier from a face on which the light conversion film is located. The first base material transmits the light and holds the light conversion film and the first gas barrier. For a light of the specific color, a light transmittance of the first base material combined with the first gas barrier
(Continued)

is higher than a light transmittance of the first base material alone.

11 Claims, 4 Drawing Sheets

(51) Int. Cl.
    *G02F 1/1335*     (2006.01)
    *H01L 33/50*     (2010.01)
    *G02B 5/20*     (2006.01)

(52) U.S. Cl.
    CPC ............ *G02F 1/1335* (2013.01); *H01L 33/50* (2013.01); *C09K 2323/031* (2020.08); *G02F 1/133614* (2021.01); *G02F 2202/36* (2013.01); *H01L 33/502* (2013.01)

(56) References Cited

FOREIGN PATENT DOCUMENTS

| | | | |
|---|---|---|---|
| JP | 2017-94557 A | 6/2017 | |
| JP | 6800721 B2 * | 12/2020 | ............... B32B 7/02 |

\* cited by examiner

LIGHT CONVERSION MEMBER

CROSS-REFERENCE TO RELATED APPLICATIONS

This application is a U.S. National stage of International Application No. PCT/JP2017/039361 filed on Oct. 31, 2017. This application claims priority to Japanese Patent Application No. 2016-235709 filed on Dec. 5, 2016 with Japan Patent Office. The entire disclosure of Japanese Patent Application No. 2016-235709 is hereby incorporated herein by reference.

BACKGROUND

Field of the Invention

The present invention relates to a light conversion member having a barrier film, and more particularly relates to a light conversion member in which the light transmittance is raised and the amount of light that is outputted is raised. The present invention further relates to a display device that includes this light conversion member having a barrier film.

Background Information

In recent years, as color reproducibility has been increased (the color gamut expanded) in liquid crystal displays, quantum dots have been attracting attention as a light conversion material. When blue light from a backlight is incident on a light conversion film including quantum dots, it is emitted after being converted into red and green light by two types of quantum dots of different sizes. When this is done, it is possible to create an RGB light source having a sharp peak in combination with the blue light that passes through without being converted, and it is anticipated that the color gamut can be greatly expanded.

However, a problem with quantum dots is that when they come into contact with moisture or oxygen, the light emission intensity is reduced due to a photooxidation reaction. Japanese Patent Application Publication No. 2015-65158 (Patent Literature 1) describes a configuration in which a barrier film is laminated and bonded to a light conversion film containing quantum dots, in order to protect the quantum dots from moisture and oxygen.

SUMMARY

In the configuration of Patent Literature 1, if a barrier layer is formed in an unplanned manner, there is a possibility that the light transmittance will drop as shown in FIG. 2.

In FIG. 2, the broken line indicates the light transmittance of a combination of a base material and a barrier layer, in which the barrier layer has been formed in an unplanned manner, and the solid line indicates the light transmission of the base material alone before the formation of the barrier layer. It is shown that the light transmittance of the combination of the base material and the barrier layer is lower than the light transmittance of the base material alone within the range of light wavelengths from around 450 nm to around 750 nm.

In view of the above-mentioned problem, it is an object of the present invention to provide a light conversion member with which high output luminance can be obtained even if a barrier layer is formed.

In order to solve the above problem, present invention provides a light conversion member having a light conversion film that converts the color of light from a specific color, a first gas barrier that is located on the side of the light conversion film where the light to be converted is incident, and is made up of one or more gas barrier layers that prevent moisture and gas from entering the light conversion film, and a first base material that is located on the opposite side of the first gas barrier from the face on which the light conversion film is located, that transmits light, and that holds the light conversion film and the first gas barrier, wherein the first gas barrier that is used is such that, for a light of the specific color, a light transmittance of the first base material combined with the first gas barrier is higher than a light transmittance of the first base material alone.

The use of a gas barrier characterized in that, for light of a specific color on the incident side, the light transmittance of the first base material combined with the first gas barrier is higher than the light transmittance of the first base material alone, raises the amount of incident light converted by the light conversion film, also raises the light amount converted by the light conversion film, and allows a high output luminance to be obtained.

This light conversion member may have a second gas barrier that is located on the side of the light conversion film where the converted light is outputted, and that is made up of one or more gas barrier layers that prevent moisture and gas from entering the light conversion film and a second base material that is located on the opposite side of the second gas barrier from the face where the light conversion film is located, that transmits light, and that holds the light conversion film and the second gas barrier, wherein the second gas barrier that is used is such that, for at least red, green, and blue light, the light transmittance of the second base material combined with the second gas barrier is higher than the light transmittance of the second base material alone.

In particular, when red, green, and blue light are strongly outputted from the light conversion film, it is possible to minimize the drop in the amounts of this light, and to obtain even higher output luminance.

The light conversion film may use a resin containing quantum dots or a phosphor, and the light of a specific color may be blue.

Increasing the light transmittance of the gas barrier for blue light yields higher output luminance in a light conversion member that makes use of quantum dots or a phosphor to convert blue light to another color.

The light conversion member of the present invention may be used in a display.

Using the light conversion member of the present invention in a display yields higher output luminance.

DETAILED DESCRIPTION OF EMBODIMENTS

Embodiments of the present invention will now be described.

First Embodiment

Figure 1A:
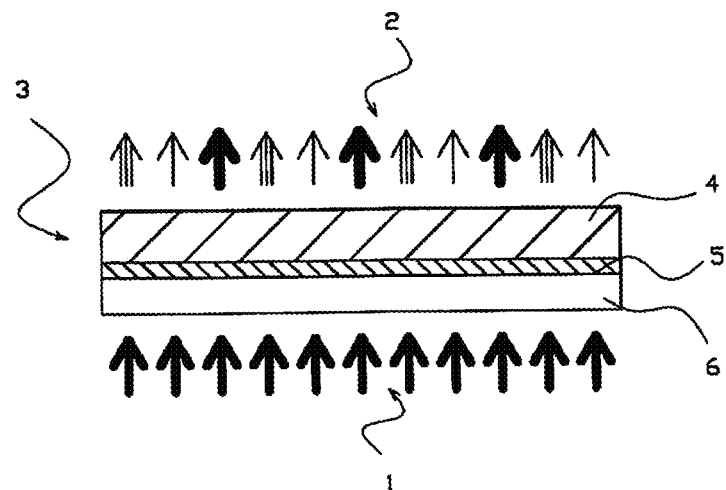
FIG. 1A is a diagram illustrating the simplified configuration of the light conversion member in a first embodiment of the present invention.

A first embodiment of the present invention will be described with reference to FIG. 1A. FIG. 1A is a diagram illustrating the simplified configuration of the light conversion member in the first embodiment of the present invention.

As shown in FIG. 1A, the light conversion member 3 comprises a light conversion film 4 that converts light of a specific color of the incident light 1 and outputs this as output light 2, a gas barrier 5 consisting of one or more gas barrier layers that prevent the entry of moisture or gas to the light conversion film 4 on the incident light 1 side, and a base material 6 that holds the light conversion film 4 and the gas barrier 5 on the incident light 1 side of the gas barrier 5.

The light conversion film 4 includes quantum dots, a phosphor, or the like, and converts blue light into red and green light, for example. This film is blocked off by the gas barrier 5 since the infiltration of moisture or gas will lower the light conversion rate.

The gas barrier layers constituting the gas barrier 5 are composed of an inorganic material that transmits light, such as SiCN or $SiO_2$, for example. If there are multiple gas barrier layers, layers (intermediate layers) having properties to improve the smoothness of the laminated surface and to increase adhesion between the gas barrier layers are sometimes provided, and in this embodiment the gas barrier layers are defined as also including intermediate layers.

The gas barrier layers may be made of the same or different materials. The thickness of the various gas barrier layers may also be the same or different.

Figure 3:
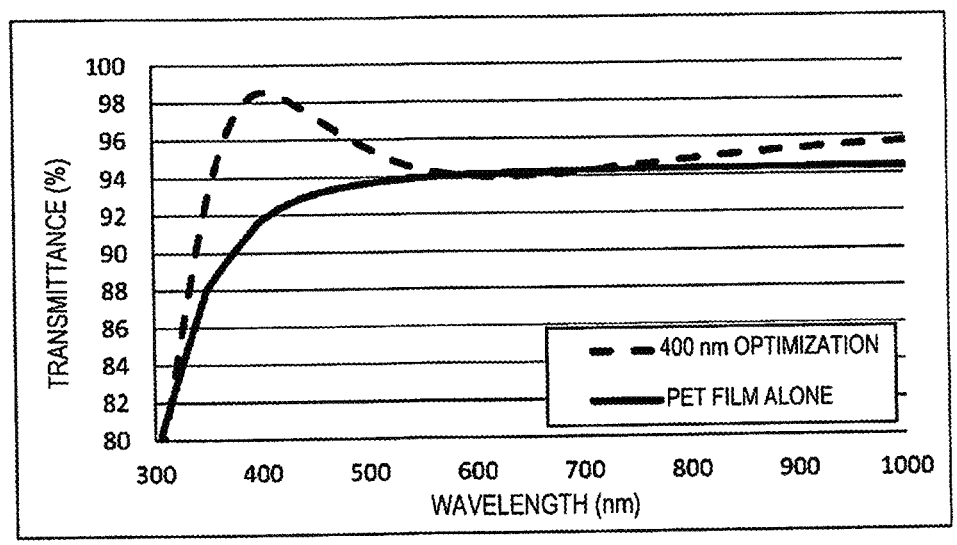
FIG. 3 is a graph of an example of the light transmittance of the base material and that of the base material combined with the gas barrier in the first embodiment of the present invention.

Further, the number of gas barrier layers constituting the gas barrier 5 may be one or more, with no limit on the number of layers. When the gas barrier 5 on the incident light 1 side is designed so that the light transmittance of a specific color as shown in FIG. 3 will be higher than the light transmittance of other colors and will stand out with a peaked distribution, it is preferable for the gas barrier 5 to be made up of two or more gas barrier layers.

The base material 6 is preferably a film with high transparency. For example, it may be a film of PEN, PET, or the like, and may be different from each other.

The gas barrier layers that form the gas barrier 5 are adjusted such that the gas barrier 5 is such that the light transmittance of the base material 6 combined with the gas barrier 5 with respect to blue light (the wavelength thereof) will be higher than the light transmittance of the base material 6 alone.

Figure 2:
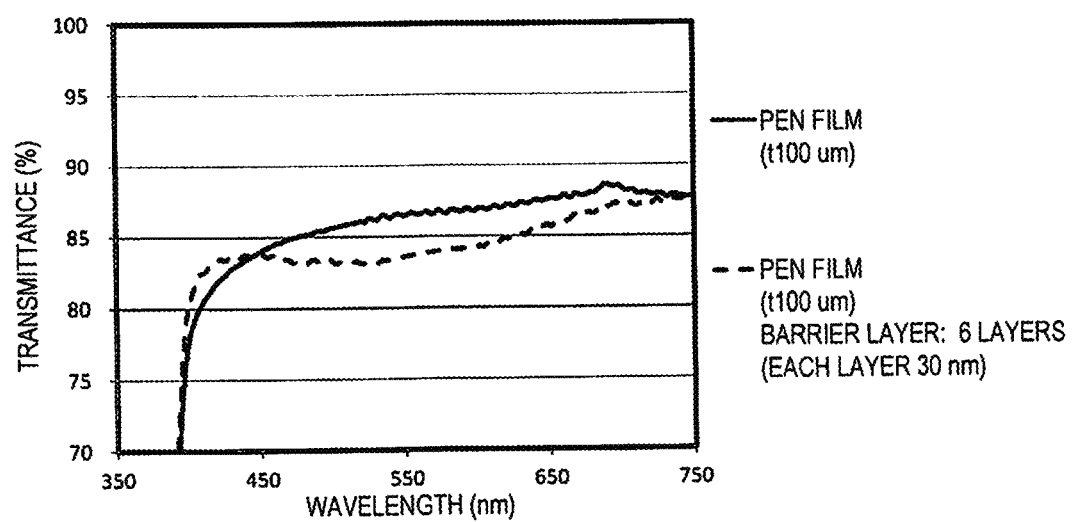
FIG. 2 is a graph of the light transmittance of a base material alone and the light transmittance of a base material combined with a gas barrier in a comparative example.

As an example for comparison with the present invention, FIG. 2 shows the light transmittance of the base material 6 alone and the light transmittance of the base material 6 combined with a gas barrier 5 in which the gas barrier layers constituting the gas barrier 5 have not been adjusted.

Table 1 shows the configuration of the gas barrier layers constituting the gas barrier and the base material used in FIG. 2. In Table 1, the gas barrier layers are numbered 1 to 6 in the order of their layout, with the gas barrier layer 6 being the one closest to the base material.

TABLE 1

|  | Material | Thickness |
| --- | --- | --- |
| gas barrier layer 1 | $SiO_2$ | 30.00 nm |
| gas barrier layer 2 | SiCN | 30.00 nm |
| gas barrier layer 3 | $SiO_2$ | 30.00 nm |
| gas barrier layer 4 | SiCN | 30.00 nm |
| gas barrier layer 5 | $SiO_2$ | 30.00 nm |
| gas barrier layer 6 | SiCN | 30.00 nm |
| base material | PEN | 100 μm |

In the example shown in FIG. 2, when the gas barrier 5 is added to the base material 6 alone, the light transmittance of the combination of the base material 6 and the gas barrier 5 drops.

By contrast, in the gas barrier 5 used in the present invention, the light refractive index of the gas barrier layers forming the gas barrier 5 is selected and the thickness of the gas barrier layer is adjusted so that the light transmittance of a combination of the base material 6 and the gas barrier 5 with respect to light of a specific color (wavelength) will be higher than the light transmittance of the base material 6 alone.

Here, when the light transmittance of the combination of the base material 6 and the gas barrier 5 is made higher than the light transmittance of the base material 6 alone for a single color, it is possible to obtain higher transmittance than when the transmittance of the entire visible light band is raised, so the effect is improved.

In particular, when the light incident on the light conversion film is monochromatic, it is preferable to form the gas barrier so that the peak of transmittance matches the color of the incident light.

To illustrate this, FIG. 3 shows an example of using a gas barrier 5 in which the gas barrier layers constituting the gas barrier 5 have been adjusted such that the light transmittance of a combination of the base material 6 and the gas barrier 5 is increased for light with a wavelength of about 400 nm (blue light).

Here, in FIG. 3, the broken line indicates a base material in which the gas barrier layers are formed such that the light transmittance of a combination of the base material and the gas barrier layers will be maximized for light with a wavelength of about 400 nm (blue light) with respect to the light transmittance of other colors, and the solid line indicates the base material before a gas barrier layer has been formed.

Table 2 shows the configuration of the gas barrier layers constituting the gas barrier and the base material used in FIG. 3. In Table 2, the gas barrier layers are numbered 1 to 6 in the order of their layout, with the gas barrier layer 6 being the one closest to the base material.

TABLE 2

|  | Material | Thickness |
| --- | --- | --- |
| gas barrier layer 1 | $SiO_2$ | 50.00 nm |
| gas barrier layer 2 | SiCN | 10.68 nm |
| gas barrier layer 3 | $SiO_2$ | 20.00 nm |
| gas barrier layer 4 | SiCN | 49.03 nm |
| gas barrier layer 5 | $SiO_2$ | 48.83 nm |
| gas barrier layer 6 | SiCN | 10.14 nm |
| base material | PET | 100 μm |

Using a gas barrier 5 in which the gas barrier layers have been adjusted raises the light transmittance of the combination of the base material 6 and the gas barrier 5 higher than the light transmittance of the base material 6 alone for a specific color.

The result of using a gas barrier 5 characterized by the fact that the light transmittance of a combination of the base material 6 and the gas barrier 5 is higher than the light transmittance of the base material 6 alone for light of the specific color on the incident side of the light conversion film 4 is that, with a given amount of incident light 1, compared to when the base material 6 is used alone and no gas barrier 5 is used, more of the light reaching the light conversion film 4 is converted, which also raises the amount of light converted by the light conversion film 4 and affords higher output luminance. In addition, power consumption is reduced at the same output luminance as in prior art.

Second Embodiment

Figure 1B:
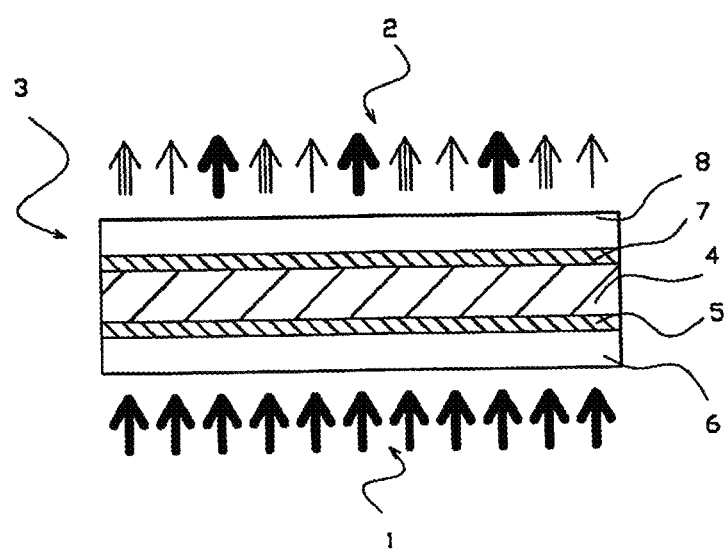
FIG. 1B is a diagram illustrating the simplified configuration of the light conversion member in a second embodiment of the present invention.

A second embodiment of the present invention will be described with reference to FIG. 1B. FIG. 1B is diagram illustrating the simplified configuration of the light conversion member in the second embodiment of the present invention.

As shown in FIG. 1B, the light conversion member 3 comprises a light conversion film 4 that converts light of a specific color of the incident light 1 and outputs this as output light 2, a gas barrier 5 consisting of one or more gas barrier layers that prevent the entry of moisture or gas to the light conversion film 4 on the incident light 1 side, and a base material 6 that holds the light conversion film 4 and the gas barrier 5 on the incident light 1 side of the gas barrier 5.

Also, on the output light 2 side of the light conversion film 4 are provided a gas barrier 7 consisting of one or more gas barrier layers that prevent moisture and gas from entering the light conversion film 4, and a base material 8 that holds the light conversion film 4 and the gas barrier 7 on the output side of the light conversion film 4.

Just as in the first embodiment, the light conversion film 4 includes quantum dots, a phosphor, or the like, and converts blue light into red, green, and blue light, for example. Since the infiltration of moisture or gas will lower the light conversion rate, the light conversion film 4 is blocked of by the gas barrier 5 and the gas barrier 7.

The gas barrier layers constituting the gas barrier 5 and the gas barrier 7 are composed of an inorganic material that transmits light, such as SiCN or $SiO_2$, for example, just as in the first embodiment. If there are multiple gas barrier layers, layers (intermediate layers) having properties to improve the smoothness of the laminated surface and to increase adhesion between the gas barrier layers are sometimes provided, and in this embodiment the gas barrier layers are defined as also including intermediate layers.

The gas barrier layers may be made of the same or different materials. The thickness of the various gas barrier layers may also be the same or different.

Further, the number of gas barrier layers constituting the gas barrier 5 may be one or more, with no limit on the number of layers. When the gas barrier 5 on the incident light 1 side is designed so that the light transmittance of a specific color as shown in FIG. 3 will be higher than the light transmittance of other colors and will stand out with a peaked distribution, it is preferable for the gas barrier 5 to be made up of two or more gas barrier layers.

The base material 6 and the base material 8 are preferably films with high transparency. For example, they may be a film of PEN, PET, or the like, and may be different from each other. Also, the material and thickness of the base material 6 and the base material 8 may be the same or different.

In the gas barrier 5 used in the present invention, the light refractive index of the gas barrier layers forming the gas barrier 5 is selected and the thickness of the gas barrier layers is adjusted so that the light transmittance of a combination of the base material 6 and the gas barrier 5 with respect to light of a specific color (wavelength) will be higher than the light transmittance of the base material 6 alone.

In the gas barrier 7 used in the present invention, light refractive index of the gas barrier layers forming the gas barrier 7 is selected and the thickness of the gas barrier layers is adjusted so that the light transmittance of a combination of the base material 8 and the gas barrier 7 with respect to at least red, green, and blue light (the wavelengths thereof) will be higher than the light transmittance of the base material 8 alone.

Figure 4:
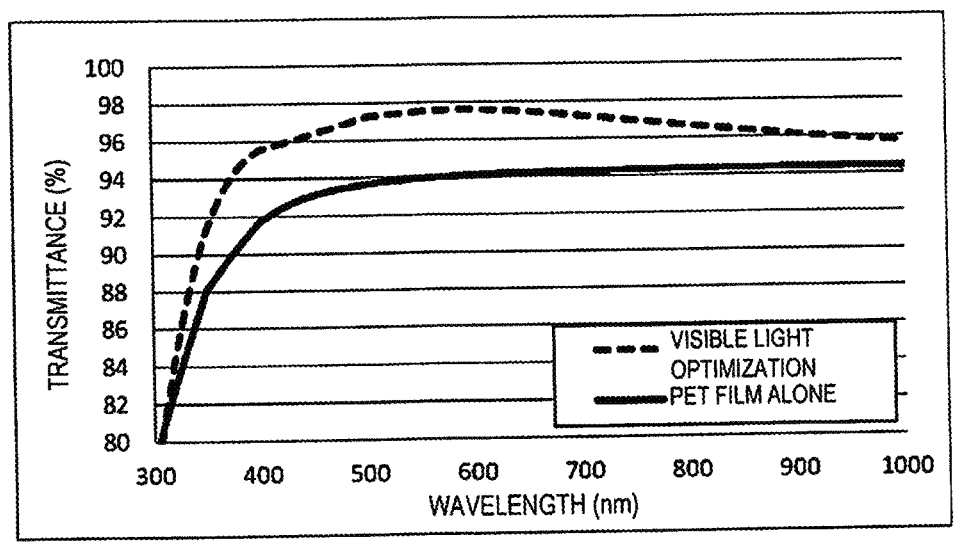
FIG. 4 is a graph of an example of the light transmittance of the base material and that of the base material combined with the gas barrier in the second embodiment of the present invention.

To illustrate this in the case of visible light, FIG. 4 shows an example in which the material and thickness of the base material 8 are the same as in the example shown in FIG. 3, and a gas barrier 7 is used in which the gas barrier layers constituting the gas barrier 7 have been adjusted so as to raise the light transmittance of a combination of the base material 8 and the gas barrier 7.

Here, in FIG. 4, the broken line indicates a base material in which the gas barrier layers are formed such that the light transmittance of a combination of the base material and the gas barrier layers will be higher than the light transmittance of the base material along over the range of visible light, and the solid line indicates the base material alone, before a gas barrier layer has been formed.

Table 3 shows the configuration of the gas barrier layers constituting the gas barrier and the base material used in FIG. 4.

In Table 3, the gas barrier layers are numbered 1 to 6 in the order of their layout, with the gas barrier layer 6 being the one closest to the base material.

TABLE 3

|  | Material | Thickness |
| --- | --- | --- |
| gas barrier layer 1 | $SiO_2$ | 50.32 nm |
| gas barrier layer 2 | SiCN | 8.64 nm |
| gas barrier layer 3 | $SiO_2$ | 30.27 nm |
| gas barrier layer 4 | SiCN | 50.26 nm |
| gas barrier layer 5 | $SiO_2$ | 9.78 nm |
| gas barrier layer 6 | SiCN | 44.59 nm |
| base material | PET | 100 μm |

Using a gas barrier 7 in which the gas barrier layers have been adjusted raises the light transmittance of a combination of the base material 8 and the gas barrier 7 higher than the light transmittance of the base material 8 alone for visible light.

The result of using this light conversion member 3 is that, compared to when the base material 6 is used alone and this light conversion member 3 is not used, at a given amount of incident light 1, the amount of a specific light reaching the light conversion film 4 will be larger, so the amount of light converted by the light conversion film 4 will also be larger. Further, since the light transmittance on the output side is also increased, the amount of output light 2 also increases further, and higher output luminance can be obtained. In addition, power consumption is reduced at the same output luminance as in prior art.

In the second embodiment, when a light conversion film including quantum dots is used as the light conversion film 4, and the incident light 1 is blue light in which the wavelength range of the blue light emitted from a blue LED or the like is pronounced, particularly for red, green, and blue light, it is more effective to use a gas barrier 7 on the output side in which the light transmittance of a combination of the base material 8 and the gas barrier 7 is higher than the light transmittance of the base material 8 alone.

In particular, a light conversion film containing quantum dots converts the blue light emitted from a blue LED or the like into red and green light in which the wavelength range of each color of light is pronounced, so the light transmittance of a combination of the gas barrier 7 and the base material 8 preferably has the characteristic of peaking for these colors of light. Consequently, red, green, and blue light having higher brightness can be outputted at the light conversion film 4.

In the configuration of the second embodiment, when blue light emitted from a blue LED or the like is used as the incident light 1, and a light transmitting film including a yellow phosphor that converts blue to white light is used as the light conversion film 4, it is more effective to use a gas barrier 7 on the output side in which the light transmittance of a combination of the base material 8 and the gas barrier 7 is higher than the light transmittance of the base material 8 alone, but with good balance with respect to the entire visible light spectrum, as shown in FIG. 4.

The light conversion member of the present invention may be used in a display.

Using the light conversion member of the present invention in a display allows higher output luminance to be obtained, and the color gamut to be expanded. Also, power consumption can be reduced at the same output luminance as in prior art.

With the light conversion member described above, high output luminance can be obtained even if a barrier layer is formed.

The light conversion member of the present invention is not limited to what was described above, and other embodiments are possible within the scope of the present invention. For instance, the "specific color" referred to in the present invention may include something other than the visible light range, such as ultraviolet.

The invention claimed is:

1. A light conversion member comprising:
  a light conversion film containing quantum dots or a phosphor, configured to convert color of light from a specific color;
  a first gas barrier located on a side of the light conversion film where the light to be converted is incident, the first gas barrier including two or more gas barrier layers that are configured to prevent moisture and gas from entering the light conversion film; and
  a first base material located on an opposite side of the first gas barrier from a face on which the light conversion film is located, the first base material being configured to transmit the light and holding the light conversion film and the first gas barrier,
  wherein at least two of the two or more gas barrier layers of the first gas barrier include at least one each of inorganic materials that are different, and each of the two or more gas barrier layers have a selected light refractive index and an adjusted thickness such that when combined, for the light of the specific color, the light transmittance of the first base material combined with the first gas barrier is higher than the light transmittance of the first base material alone.

2. The light conversion member according to claim 1, further comprising:
  a second gas barrier located on a side of the light conversion film where the converted light is outputted, the second gas barrier including two or more gas barrier layers that are configured to prevent moisture and gas from entering the light conversion film; and
  a second base material located on an opposite side of the second gas barrier from a face where the light conversion film is located, the second base material being configured to transmit the converted light and holding the light conversion film and the second gas barrier,
  wherein at least two of the two or more gas barrier layers of the second gas barrier include at least one each of inorganic materials that are different, and each of the gas barrier layers have a selected light refractive index and an adjusted thickness such that when combined, for at least red, green, and blue light, the light transmittance of the second base material combined with the second gas barrier is higher than the light transmittance of the second base material alone.

3. The light conversion member according to claim 2, wherein the light conversion film is made of a resin containing the quantum dots or the phosphor, and the specific color light is blue.

4. A display comprising:
  the light conversion member according to claim 3.

5. A display comprising:
  the light conversion member according to claim 2.

6. The light conversion member according to claim 1, wherein the light conversion film is made of a resin containing the quantum dots or the phosphor, and the specific color light is blue.

7. A display comprising:
  the light conversion member according to claim 6.

8. A display comprising:
  the light conversion member according to claim 1.

9. The light conversion member according to claim 1, wherein
  the first gas barrier is directly disposed on the light conversion film.

10. The light conversion member according to claim 1, wherein
  the specific color light is blue.

11. The light conversion member according to claim 1, wherein
  a surface of the first base material forms an outermost surface of the light conversion member.

* * * * *